United States Patent [19]

Driver et al.

[11] 3,866,310

[45] Feb. 18, 1975

[54] METHOD FOR MAKING THE SELF-ALIGNED GATE CONTACT OF A SEMICONDUCTOR DEVICE

[75] Inventors: Michael C. Driver, Trafford; Martin J. Geisler, Murrysville, both of Pa.

[73] Assignee: Westinghous Electric Corporation, Pittsburgh, Pa.

[22] Filed: Sept. 7, 1973

[21] Appl. No.: 395,319

[52] U.S. Cl. .......................... 29/571, 29/579, 357/41, 357/46

[51] Int. Cl. .......................... B01j 17/00

[58] Field of Search .......................... 29/578, 579, 580, 571, 29/591

[56] References Cited

UNITED STATES PATENTS

| | | | |
|---|---|---|---|
| 3,438,121 | 4/1969 | Wanlass | 29/579 |
| 3,758,943 | 9/1973 | Shibata | 29/578 |
| 3,761,785 | 9/1973 | Pruniaux | 29/579 |

*Primary Examiner*—Roy Lake
*Assistant Examiner*—W. C. Tupman
*Attorney, Agent, or Firm*—C. L. Menzemer

[57] ABSTRACT

A self-aligned gate contact of a semiconductor device is made without etching the semiconductor member during the gate contact forming step. A metal layer for forming contacts of the semiconductor device is deposited on a major surface of the semiconductor member and thereafter overlaid with a resist layer. A window pattern corresponding to the desired gate contact is formed in the resist layer, and the metal layer is undercut and removed adjacent the window pattern to expose portions of the major surface of the semiconductor member and to form overhanging portions of the resist layer adjacent the window pattern. Simultaneously with the undercutting, at least portions of contacts of the semiconductor device are formed in the metal layer. The desired gate contact is then self-aligned on the major surface by deposition through the window pattern in the resist layer. The method is particularly useful in making Schottky barrier gate field-effect transistors with high frequency capability, which requires minimal distance between source and drain contacts with an electrically separate Schottky barrier gate contact therebetween.

2 Claims, 6 Drawing Figures

METHOD FOR MAKING THE SELF-ALIGNED GATE CONTACT OF A SEMICONDUCTOR DEVICE

FIELD OF THE INVENTION

The present invention relates to the making of gate contacts of semiconductor devices and particularly self-aligned Schottky barrier gate field-effect transistors (SAGFET).

BACKGROUND OF THE INVENTION

The making of self-aligned gate contacts of semiconductor devices such as the Schottky barrier gate field-effect transistors has generally required precision etching of a moat or the like in a semiconductor substrate or layer, see U.S. Pat. No. 3,678,573, granted July 25, 1972, and assigned to the same assignee as the present invention. The need for a critically controlled etching of the semiconductor member is often a major source of difficulty in maintaining quality control and high yields in production. Moreover, the etching step severely limits the geometry of the semiconductor device.

To obviate the problem, various proposals have been made to eliminate the critical etching of the semiconductor material. One approach has been to deposit the entire device from directional sources through a slit or window in metal layer overlying a spacer layer on a suitable substrate, see U.S. Pat. No. 3,669,661, issued June 13, 1972, and assigned to the same assignee as the present application. The dimensions of the components of the semiconductor device, e.g., of a field-effect transistor, source, drain and gate, and the spacings between them, thus become a function of the thickness of the spacer layer and the angle of the deposition source from an axis perpendicular to the major surface of substrate through the slit.

Another approach has been to selectively epitaxially grow facets corresponding to components of the device, e.g., source and drain, through spaced apart windows in a mask layer and overgrowing edge portions of the mask layer at the windows to form overgrown portions on the facets. After removal of the mask layer, other components of the semiconductor device, e.g., gate contact, can be automatically aligned between source and drain simply by deposition between the outgrown facets, see United States application Ser. No. 317,992, filed Dec. 26, 1972. These approaches have been useful but more complex and expensive than is commercially desirable for making semiconductor devices generally and Schottky barrier gate field-effect transistors particularly.

The Schottky barrier gate field-effect transistor is a solid state amplifying device whose operation depends on the control of current by an electric field. It works on the same principles and similar electrical characteristics as the standard junction field-effect transistor (JFET). It differs from the JFET in that the carrier depletion region and in turn gating electric field is formed in the conduction channel at least in part by a Schottky barrier rather than two PN junctions. This difference gives the Schottky barrier gate field-effect transistor electrical characteristics uniquely suited to certain applications such as high power, micro-wave amplifiers.

With the small geometries required by these devices and particularly those for high frequency applications, major problems are encountered with alignment and resolution during the fabrication process. Such devices require small source-drain contacts and source-drain contact spacings (e.g., 4 microns or less) with accurate alignment of the gate contact between them. The Schottky barrier gate contact cannot directly contact either the source or drain contacts. Otherwise a low voltage break-down or a short circuit will result. Self-alignment of the gate contact is accomplished by vapor deposition of the Schottky barrier metal through a window in a metal mask layer corresponding to the source and drain contacts of the transistor into an aperture etched in the semiconductor body or layer. The mask layer has cantilever shaped over-hangs adjacent the window that shield surface portions of the aperture and channel beneath the overhangs and prevent deposition of the metal in contact with the source and drain contacts. The cantilevered metal overhang and aperture are formed by precision etching of the semiconductor body through the window and undercutting the metal layer. See above-cited U.S. Pat. No. 3,678,573, and Proceedings of the IEEE, Vol. 59, pp. 1244–45 (Aug., 1971).

The main problem with the conventional method for making self-aligned Schottky barrier gate field-effect transistors is shaping the aperture and overhang structure by etching. In the etching step, the depth of the aperture must be controlled to a fraction of a micron to retain a predetermined thickness of the channel layer corresponding to the desired electrical characteristics for the transistor. Further, the lateral undercut of the metal contact layer must be precisely controlled to provide sufficient overhang for self-alignment but yet avoid weakening and sagging of the metal layer with the resulting misalignment of the gate contact.

The present invention overcomes these difficulties and disadvantages. It involves no etching of the semiconductor member and therefore is particularly useful in forming semiconductor devices in thin, epitaxial layers. In addition, the spacing between source and drain contacts and the spacing of the gate contact therebetween can be kept to an absolute minimum and can be accurately predetermined and established with a single photoresist step and without the need for complicated sequential depositions or epitaxial growth of various device components.

SUMMARY OF THE INVENTION

A method is provided for automatically aligning a gate contact of a semiconductor device such as a field-effect transistor on deposition without etching the semiconductor material while simultaneously forming at least portions of other contacts of the semiconductor member. The method is therefore particularly useful in making semiconductor devices in thin, epitaxial layers. Further, only one photoresist step is needed without selective epitaxial growth or precision sequential depositions. Thus, the method provides for a simplified manufacturing technique and relatively high production yields.

In making a self-aligned gate, a semiconductor member is provided by a single-crystal semiconductor substrate such as silicon, germanium or gallium arsenide, or by a single-crystal insulator substrate such as sapphire on which a semiconductor layer such as silicon, germanium or gallium arsenide is epitaxially grown. For forming a field-effect transistor, the semiconductor member preferably has a low resistivity region adjoining the major surface to form the transistor's channel, and a high resistivity region adjoining the low resistivity region and extending into the interior of the semiconductor member. Preferably the low resistivity region is formed by epitaxially growing a highly doped layer on a planar major surface of a semiconductor or insulator substrate.

A metal layer, which is readily etched by an etchant to which the semiconductor member is resistant, is formed on the major surface of the semiconductor member for forming contacts of the semiconductor devicce. The metal layer is overlaid with a resist layer, i.e., a light or electron sensitive material which becomes more or less soluble and etch resistant on exposure to such radiation. At least one window pattern is then formed in the resist layer corresponding to the desired self-aligned contact. The resist layer is then undercut and removed adjacent the window pattern with an etchant to which the semiconductor member is resistant to expose portions of the major surface of the semiconductor member and cause undercut portions of the metal layer adjacent the window pattern to overhang and shield exposed portions of said major surface. Simultaneously with the undercut etch, at least portions of contacts of the semiconductor device are formed in the metal layer. In forming a field-effect transistor, source and drain contacts are preferably simultaneously formed during this etching step.

Thereafter, the contact is deposited and automatically aligned by depositing a suitable metal from a directional source, e.g., by vapor deposition, through the window pattern onto unshielded, exposed portions of the major surface of the semiconductor member to form a self-aligned contact of the semiconductor device.

Other details, objects and advantages of the invention will become apparent as the following description of a present preferred embodiment and a present preferred method of practicing the same proceeds.

BRIEF DESCRIPTION OF THE DRAWINGS

In the accompanying drawings, the present preferred embodiments of the invention and the present preferred methods of practicing the invention are illustrated.

DESCRIPTION OF THE PREFERRED EMBODIMENT

Figures 1, 2, 3, 4, 5, 6:
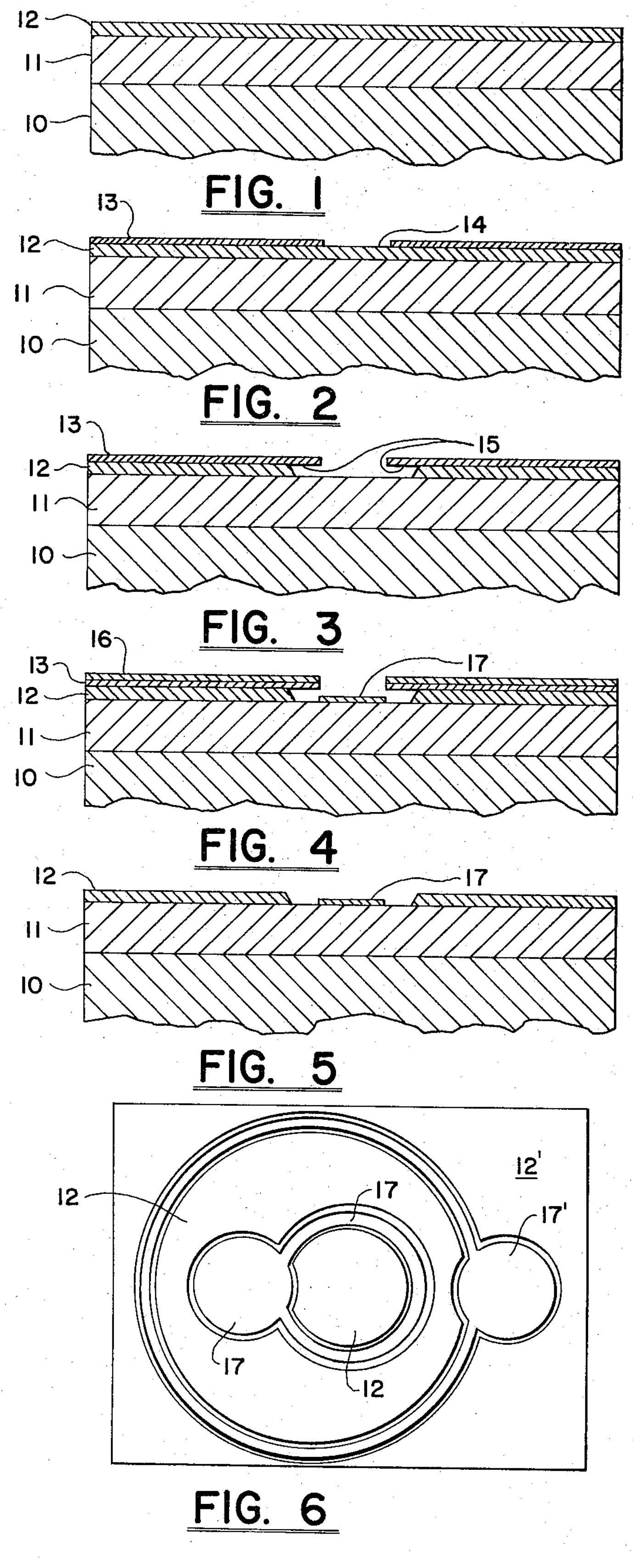
FIGS. 1, 2, 3 and 4 are cross-sectional views in elevation of a self-aligned Schottky barrier gate field-effect transistor at various stages of fabrication.
FIG. 5 is a cross-sectional view in elevation of a completed self-aligned Schottky barrier gate field-effect transistor.
FIG. 6 is a top view of a completed self-aligned Schottky barrier gate field-effect transistor.

The present invention is particularly described in making a self-aligned Schottky barrier gate field-effect transistor. It is understood that this application is the preferred application of present invention, but that the invention may be otherwise variously used in making self-aligned contacts of semiconductor devices.

Referring to FIG. 1, substrate 10 is a single-crystal semiconductor or insulator substrate. For making a high frequency device, substrate 10 is preferably a semi-insulating gallium arsenide doped with an impurity such as chromium. Alternatively, substrate 10 may be made of any known semiconductor material, for example, silicon, germanium or Group III–V and Group II–VI semiconductor compounds, or an insulator material, for example, sapphire. The substrate is preferably intrinsic, or doped lightly, or compensation doped to provide high resistivity therethrough. However, for a high frequency field-effect transistor, substrate 10 is preferably compensation doped with gallium arsenide because of the high carrier mobility of the gallium arsenide layer which can thereby be subsequently grown on the substrate.

Layer 11 is a semiconductor layer epitaxially grown on a major surface of substrate 10 to form a semiconductor member. Substrate 10 is prepared for epitaxial growth by lapping and polishing to form a planar major surface oriented along a lattice plane and preferably the (001) plane of the single crystal. The major surface is then etched and layer 11 epitaxially grown. Preferably the etch and epitaxy growth is performed using $AsCl_3/H_2$ vapor transport system described in "The Preparation of High Purity Gallium Arsenide by Vapour Phase Epitaxial Growth" by J. R. Knight, D. Effer and P. R. Evans, Solid-State Electronics, Vol. 8, pp. 178–180 (1965).

Generally, for a field-effect transistor, the layer formed is of a thickness of 0.2 to 2.0 microns and preferably about 0.5 to 1.0 micron, and has an impurity concentration preferably between $5 \times 10^{14}/cm^3$ and $5 \times 10^{17}/cm^3$. The doping concentration and thickness of the epitaxial layer determine the gate pinch-off voltage. The thinner the epitaxial layer and the lower the doping concentration, the lower the pinch-off voltage. A silicon layer 2 microns thick doped to a concentration of $1 \times 10^{15}$ atoms/$cm^3$ has a gate pinch-off voltage of 3.2 volts.

A semiconductor member is thus provided by a single crystal semiconductor or insulator substrate, overlaid with an epitaxial semiconductor layer. For a field-effect transistor, the member has at least two regions of different resistivity that form an abrupt transition between them at the major surface of substrate 10. A low resistivity region corresponding to layer 11 adjoins the major surface of the semiconductor member and forms the channel of the transistor, while a high resistivity region extends through the interior of the member and preferably adjoins the opposed major surface. The abrupt transition between the resistivity regions may form a PN junction where the regions are formed of impurity of opposite types of conductivity. Preferably, however, the difference in resistivity is achieved by making the low resistivity region by heavily impurity doping, and by making the high resistivity region by either lightly doping, intrinsic growth, compensation doping, or proton bombardment of a semiconductor substrate, see IEEE Transactions on Electron Devices, Vol. ED–19, No. 5, p. 672 (May, 1972), or by use of an insulator substrate such as sapphire. In this connection, it is highly desirable that the channel region be of low resistivity. Further, the conductivity of the resistivity regions may be chosen so that the transistor has either an N- or P-type channel. For high carrier mobility, it is preferred, however, that the transistor has an N-type channel and particularly where a gallium arsenide semiconductor member is used. In addition, the crystalline structure match at the major surface of substrate 10 to epitaxial semiconductor layer 11 should be matched as closely as possible. Any mismatch in crystal lattice structure at the major surface reduces carrier mobility in the channel between the source and drain of a field-effect transistor. Reductions in carrier mobility reduces the maximum frequency at which the transistor will operate.

Metal layer 12 for forming contacts of the semiconductor devices, such as source and drain contacts, is then deposited on a major surface of semiconductor layer 11 to make ohmic contact therewith. Layer 12 may be any good electrical conductor such as aluminum, tin, silver, gold, platinum or gold-germanium alloy. Preferably layer 12 is deposited on layer 11 by standard vapor deposition techniques. The thickness of layer 12 may vary from a minimum of about 300 to 2000 A or more, with about 500 A being preferred.

Referring to FIG. 2 a photoresist 13 of any suitable known composition is applied to metal layer 12. A preselected window pattern 14 is then developed therein corresponding to a desired self-aligned contact for the device to be formed to semiconductor layer 12 usually by standard photolithographic techniques. For a field-effect transistor, the spacing of the window pattern 14 is crucial to the electrical charcteristics of the transistor and particularly for high frequency operation. The spacing corresponds to the gate contact width of the transistor and may be as small as 1 micron for operating frequencies above 10 GHz. The minimum spacing is limited by the resolution of the photomask technique. For very small spacings and high resolution, therefore, it may be appropriate to use an electroresist for layer 13, and the electron image projection system described in U.S. Pat. Nos. 3,679,497, granted July 25, 1972, and 3,710,101, granted Jan. 9, 1973, and assigned to the same assignee as the present application, to implant the selective differential in solubility to the resist layer.

Referring to FIG. 3, metal layer 12 is undercut and removed by etching through window pattern 14 to expose portions of the major surface of semiconductor layer 11 and cause undercut portions 15 of photoresist layer 13 adjacent the window pattern to overhang exposed portions of said surface. Any etchant to which layer 11 is resistant is appropriate for this purpose. A suitable etchant for such purpose for gallium arsenide is comprised of 50 parts sulfuric acid, 1 part water and 2 parts of hydrogen peroxide by volume, and a suitable etchant for such purpose for silicon is comprised of 1 part nitric acid, 3 parts hydrochloric acid and 4 parts water by volume.

The source and drain contacts are simultaneously formed in metal layer 12. The spacing between the source and drain contacts is also crucial to the electrical characteristics of the transistor. For this reason, the etching is carefully controlled. Preferably the progress of the undercut is observed through an optical microscope, preferably through a translucent resist, so that the proper spacing can be precisely controlled.

Referring to FIG. 4, the exposed surfaces are preferably cleaned with a light etch. The metal which is to form the desired self-aligned gate to semiconductor layer 11 is then deposited over the exposed surfaces of layers 11 and 13 from a directional source, i.e., typically vapor deposition. The metal thus forms layer 16 on exposed portions of photoresist layer 13 and layer 17 on exposed portions of semiconductor layer 11. The gate contact thus formed by layer 17 may have a thickness of from about 300 to 5000 A or more and preferably a thickness of about 2000 A.

Layer 17 is the desired contact and is deposited through window pattern 14 on the exposed portions of layer 11 which are unshielded by overhanging undercut portions 15 of layer 13. The gate contact is thus automatically aligned and spaced on layer 12. For a Schottky barrier gate field-effect transistor, the metal for layers 16 and 17 must be suitable for forming a Schottky barrier gate contact with semiconductor layer 11 corresponding to the channel of the transistor. For example, gold, aluminum, chromium, molybdenum, nickel or platinum are suitable where layer 11 is gallium arsenide.

Referring to FIG. 5, the photoresist layer 13 is removed together with overlying metal layer 16. This removal may be done by a suitable solvent to remove layer 13, which rejects metal layer 16 therewith. Preferably, however, layer 13 is removed, and layer 16 along with it, by known ultrasonic techniques.

FIG. 6 shows a finished self-aligned Schottky barrier gate field-effect transistor made by this method. The device shown is actually two field-effect transistors, one inside the other. Transistors can be made with this technique which have a gate contact width of one micron, which provides a device with an operational frequency of more than 10 GHz.

While the presently preferred embodiments of the invention and methods for performing them have been specifically described, it is distinctly understood that the invention may be otherwise variously embodied and used.

What is claimed is:

1. A method of making a self-aligned gate field-effect transistor comprising the steps of:

A. applying a metal layer suitable for forming source and drain contacts for a field-effect transistor on a major surface of a semiconductor member having a low resistivity region adjoining the major surface and a high resistivity region adjoining the low resistivity region and extending into the semiconductor member to form a channel of a field-effect transistor;

B. overlaying the metal layer with a resist layer;

C. forming in the resist layer at least one window pattern corresponding to a desired self-aligned gate contact;

D. undercutting and removing portions of the metal layer adjacent the window pattern to expose portions of the major surface of the semiconductor member and cause undercut portions of the metal layer adjacent the window pattern to overhang and shield exposed portions of said major surface;

E. simultaneously with step D, forming source and drain contacts for a field-effect transistor in the metal layer; and F. thereafter depositing metal capable of forming a Schottky barrier contact with the semiconductor member through the window pattern on unshielded exposed portions of the major surface of the semiconductor member to form a self-aligned Schottky barrier gate contact for a field-effect transistor.

2. A method of making a self-aligned gate field-effect transistor as set forth in claim 1 wherein:

the semiconductor member is formed by epitaxially growing a semiconductor layer on a substrate.

* * * * *